US012672405B2

(12) United States Patent
Lin et al.

(10) Patent No.: US 12,672,405 B2
(45) Date of Patent: Jun. 30, 2026

(54) METHOD OF TRANSFERRING MICRO-LEDS ON CIRCUIT SUBSTRATES, REMOVING SUPPORT STRUCTURE AND GRINDING EDGE OF CIRCUIT SUBSTRATE

(71) Applicant: AUO Corporation, Hsinchu (TW)

(72) Inventors: Yi-Hsin Lin, Hsinchu (TW); Wen-Lung Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 393 days.

(21) Appl. No.: 18/500,136

(22) Filed: Nov. 2, 2023

(65) Prior Publication Data

US 2024/0372046 A1     Nov. 7, 2024

(30) Foreign Application Priority Data

May 5, 2023     (TW) .................................. 112116782

(51) Int. Cl.
| | |
|---|---|
| *H10H 20/854* | (2025.01) |
| *H10H 20/01* | (2025.01) |
| *H10H 20/853* | (2025.01) |
| *H10H 20/857* | (2025.01) |
| *H10P 72/70* | (2026.01) |
| *H10W 90/00* | (2026.01) |

(52) U.S. Cl.
CPC .......... *H10H 20/854* (2025.01); *H10W 90/00* (2026.01); *H10H 20/0362* (2025.01)

(58) Field of Classification Search
CPC ............. H10H 20/854; H10H 20/0362; H10H 20/0364; H10H 20/01; H10H 20/857; H10H 20/018; H10H 20/853; H10W 90/00; H01L 25/0753; H01L 25/167; H01L 25/50; H10P 72/7402
See application file for complete search history.

(56) References Cited

U.S. PATENT DOCUMENTS

| | | | |
|---|---|---|---|
| 11,515,511 B2 | 11/2022 | Li et al. | |
| 11,805,680 B2 | 10/2023 | Li et al. | |
| 2007/0071911 A1* | 3/2007 | Takaku | G02F 1/13475 |
| | | | 252/299.1 |
| 2021/0066562 A1* | 3/2021 | Hsieh | H10H 20/857 |
| 2021/0265590 A1* | 8/2021 | Wang | H10K 77/111 |
| 2022/0006062 A1 | 1/2022 | Li et al. | |
| 2022/0122953 A1* | 4/2022 | Hwang | H01L 25/0753 |
| 2022/0384551 A1 | 12/2022 | Li et al. | |

FOREIGN PATENT DOCUMENTS

| | | | |
|---|---|---|---|
| CN | 107863357 | 3/2018 | |
| CN | 112740415 | 4/2021 | |
| CN | 112840462 | 5/2021 | |
| CN | 113889497 | 1/2022 | |
| CN | 114792678 | 7/2022 | |
| JP | 11218768 A | * 8/1999 | G02F 1/1339 |

* cited by examiner

*Primary Examiner* — Herve-Louis Y Assouman
(74) *Attorney, Agent, or Firm* — JCIPRNET

(57) ABSTRACT

A display panel includes a circuit substrate, a first supporting structure, a glue layer residue and light-emitting diodes. The circuit substrate has electrodes. The first supporting structure is located outside the electrodes on the circuit substrate. The glue layer residue is located on the first supporting structure. The light-emitting diodes are electrically connected to the electrodes.

5 Claims, 20 Drawing Sheets

10

A'

500'

10

A

METHOD OF TRANSFERRING MICRO-LEDS ON CIRCUIT SUBSTRATES, REMOVING SUPPORT STRUCTURE AND GRINDING EDGE OF CIRCUIT SUBSTRATE

CROSS-REFERENCE TO RELATED APPLICATION

This application claims the priority benefit of Taiwan application serial no. 112116782, filed on May 5, 2023. The entirety of the above-mentioned patent application is hereby incorporated by reference herein and made a part of this specification.

BACKGROUND

Technical Field

The invention is related to a display panel and a fabrication method thereof.

Description of Related Art

Micro light-emitting diode display (micro-LED display) is a highly competitive display device. The key technology in the production of micro-LED displays lies in how to transfer a large number of micro-LEDs onto a circuit substrate. Generally, the transfer technology involves mechanical operations, and the effectiveness of the transfer technology depends on the precision of the machinery and the accuracy and yield of the transfer device itself. When picking up the micro-LEDs, there may be errors in the operation of the machine and inaccuracies in the transfer device, and when placing the micro-LEDs, there may be another machine operation misalignment error. If the micro-LEDs are not placed in the correct position, the micro-LEDs will not function properly.

SUMMARY

This invention provides a display panel and its fabrication method that can enhance the yield of the light-emitting diode transfer process and shorten the production cycle time (Tact time).

At least one embodiment of the present invention provides a fabrication method of a display panel, which includes the following steps. A circuit substrate with a plurality of electrodes on a surface thereof is provided. A first supporting structure and a second supporting structure are formed on the circuit substrate, wherein the first supporting structure is located outside the electrodes on the circuit substrate, the second supporting structure is located outside the first supporting structure on the circuit substrate, and there is a gap between the first supporting structure and the second supporting structure. A glue layer is formed in a gap between the first supporting structure and the second supporting structure. A plurality of light-emitting diodes are transferred onto the circuit substrate using a transfer device, wherein the transfer device is pressed on the glue layer and the light-emitting diodes are located on the electrode. The glue layer is removed, leaving a glue layer residue on the first supporting structure and the second supporting structure. The transfer device is removed, leaving the light-emitting diodes on the circuit substrate. The circuit substrate is cut to remove the second supporting structure. An edge of the circuit substrate is ground.

At least one embodiment of the present invention provides a display panel, including a circuit substrate, a first supporting structure, a glue layer residue and a plurality of light-emitting diodes. The circuit substrate has a plurality of electrodes. The first supporting structure is located outside the electrode on the circuit substrate. The glue layer residue is located on the first supporting structure. The light-emitting diodes are electrically connected to the electrodes.

DESCRIPTION OF THE EMBODIMENTS

Figure 1A:
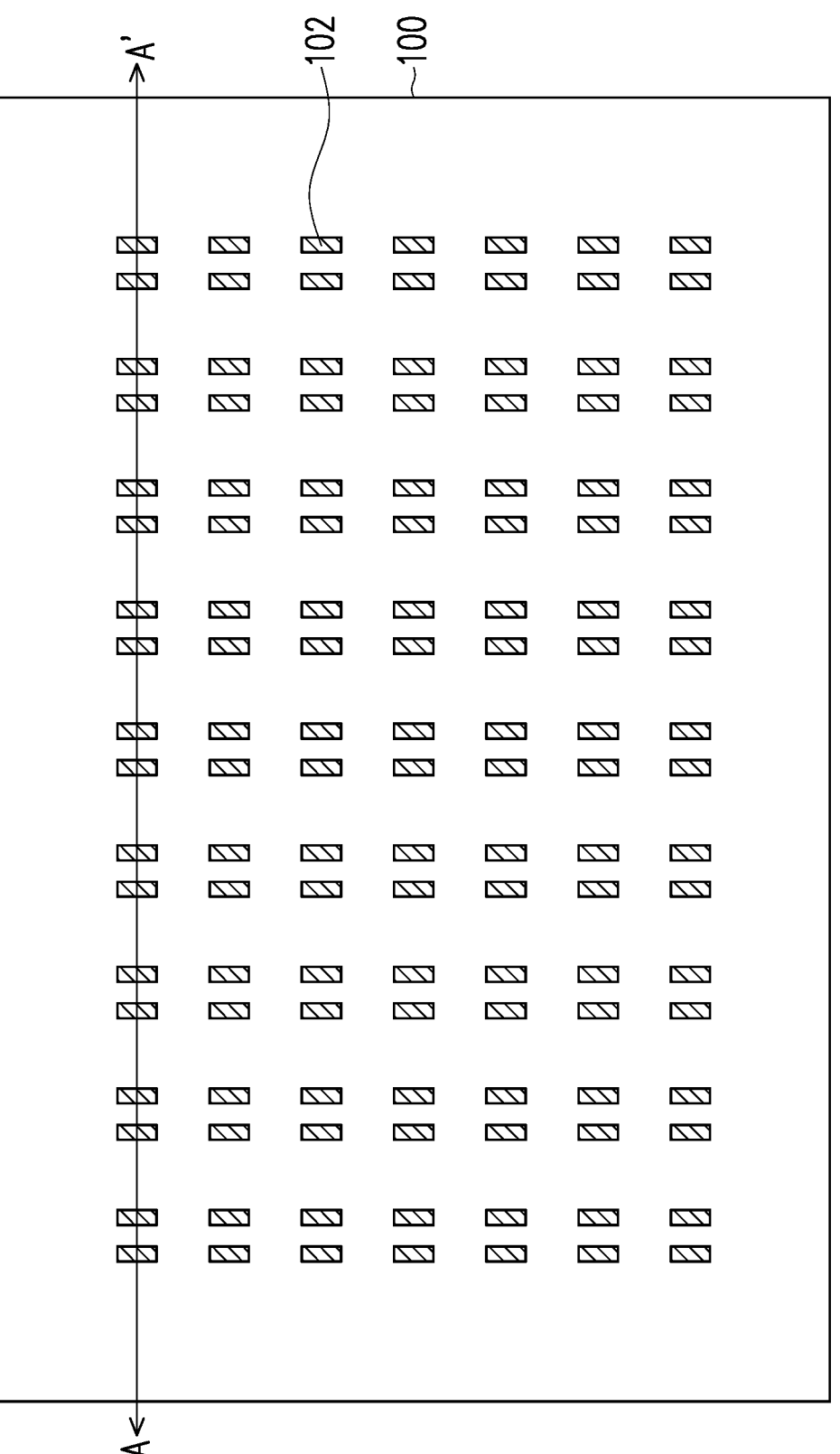
FIG. 1A to FIG. 1H are schematic top views of a fabrication method of a display panel according to an embodiment of the present invention.

FIG. 1A to FIG. 1H are schematic top views of a fabrication method of a display panel according to an embodiment of the present invention. FIG. 2A to FIG. 2H are schematic cross-sectional views along line A-A' of FIG. 1A to FIG. 1H, respectively. Referring to FIG. 1A and FIG. 2A, a circuit substrate 100 is provided. The surface of the circuit substrate 100 has a plurality of electrodes 102. In some embodiments, the circuit substrate 100 includes a substrate and a circuit structure located on the substrate. The circuit structure includes wires, active components, passive components, and more, with the electrodes 102 located on the surface of the circuit structure. The substrate of the circuit substrate 100 may be either a rigid substrate, a flexible substrate, or a stretchable substrate.

Figure 1B:
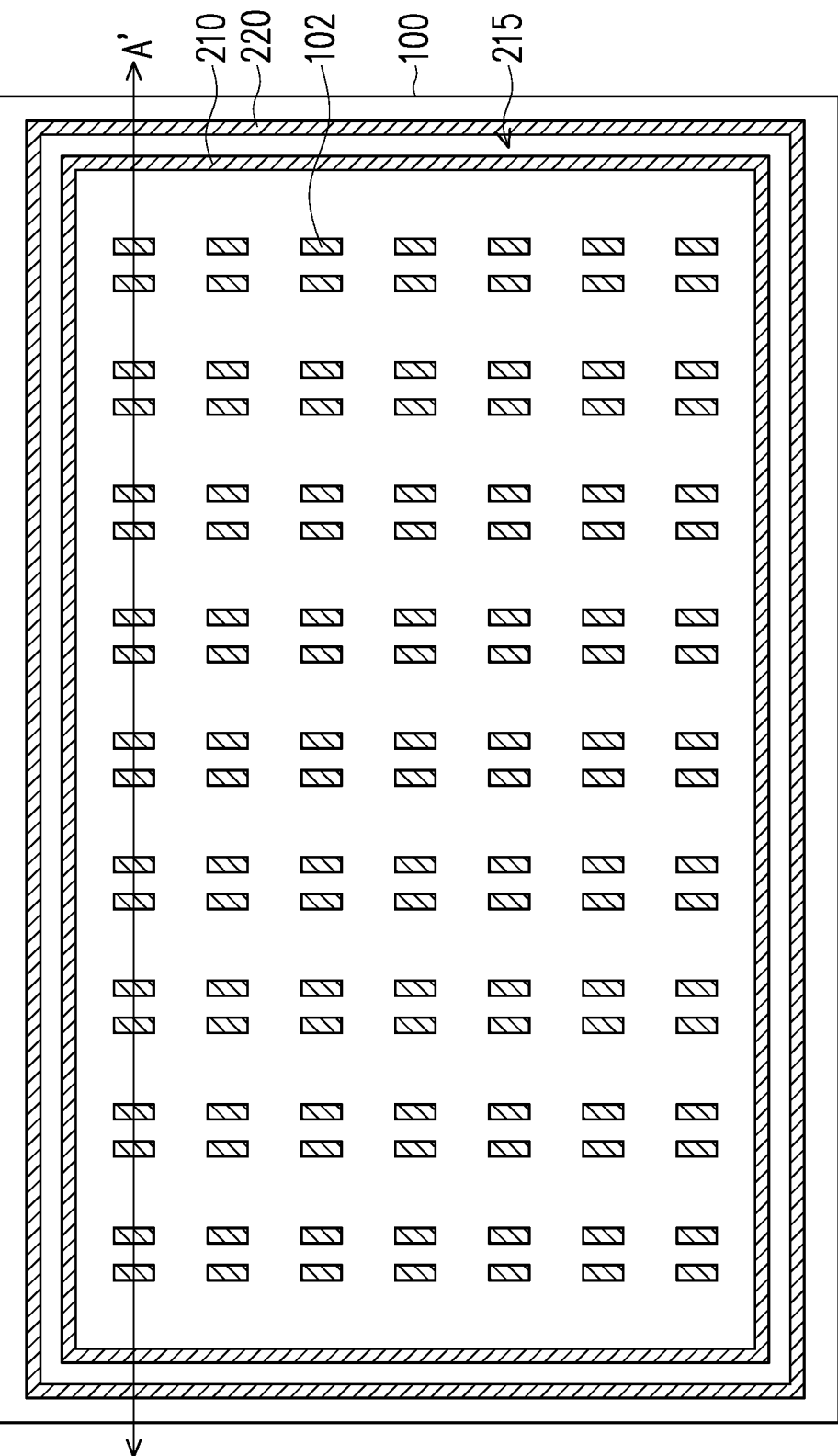
Figure 2A:
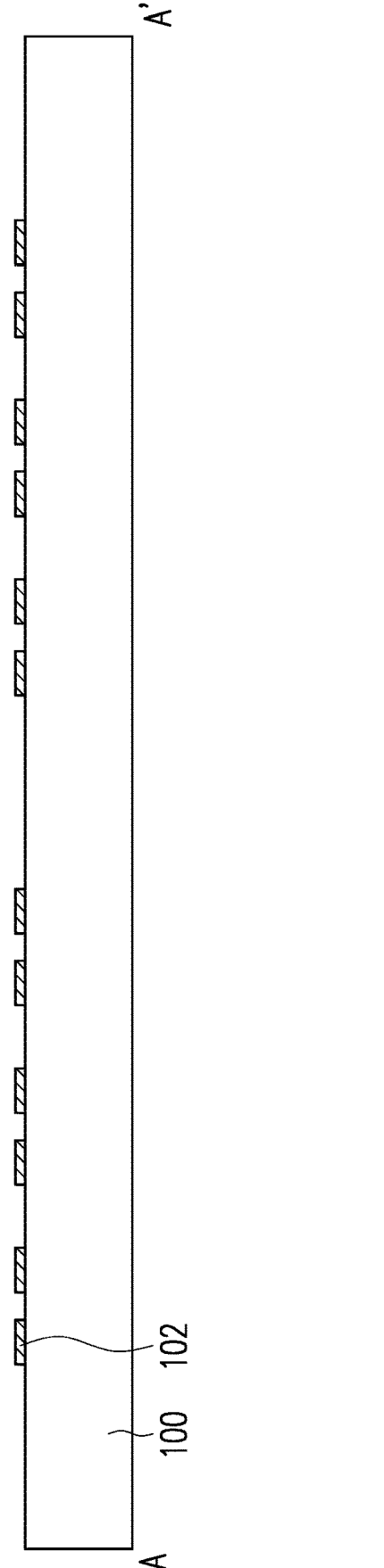
FIG. 2A to FIG. 2H are schematic cross-sectional views along line A-A' of FIG. 1A to FIG. 1H, respectively.
Figure 2B:
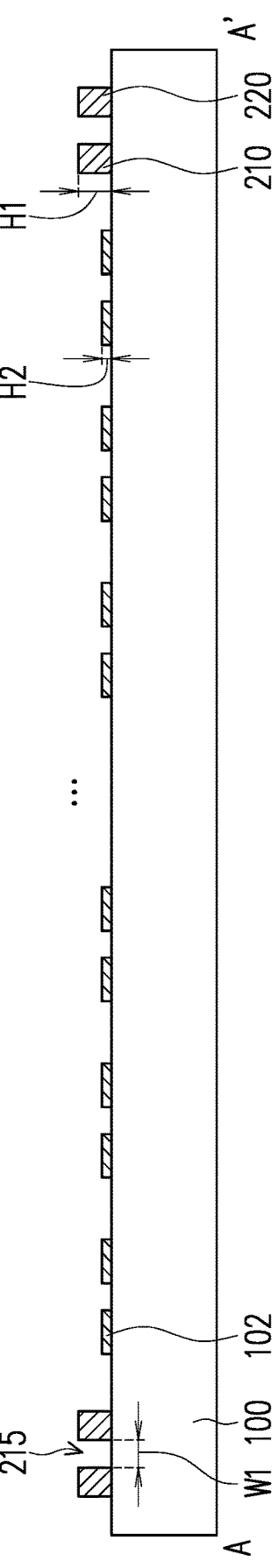

Referring to FIG. 1B and FIG. 2B, a first supporting structure 210 and a second supporting structure 220 are formed on the circuit substrate 100. The first supporting structure 210 is located outside the electrodes 102 on the circuit substrate 100, and the second supporting structure 220 is located outside the first supporting structure 210 on the circuit substrate 100. In this embodiment, the first supporting structure 210 surrounds the electrodes 102, and the second supporting structure 220 surrounds the first supporting structure 210. The first support structure 210 and the second support structure 220 are either closed rings or open rings, and both the first support structure 210 and the second support structure 220 may be circular or non-circular in shape. In some embodiments, the height H1 of the first supporting structure 210 and the second supporting structure 220 is 1000 angstroms to 10 micrometers. In some embodiments, the height H1 of the first supporting structure 210 and the second supporting structure 220 is greater than the height H2 of the electrodes 102, thereby allowing the first supporting structure 210 to serve as a retaining wall for the subsequently formed flux layer.

In some embodiments, a method of forming the first supporting structure 210 and the second supporting structure 220 includes: forming a supporting material layer on the circuit substrate 100, and then patterning the supporting material layer to form the first supporting structure 210 and the second supporting structure 220. The aforementioned supporting material layer may have a single-layer or multi-layer structure. In other words, the first supporting structure 210 and the second supporting structure 220 may have a single-layer or multi-layer structure. In some embodiments, the materials of the first supporting structure 210 and the second supporting structure 220 include polystyrene, cured photoresist, or other suitable materials.

There is a gap 215 between the first supporting structure 210 and the second supporting structure 220. In some embodiments, gap 215 has a width W1 of 100 micrometers to 3000 micrometers.

Figure 1C:
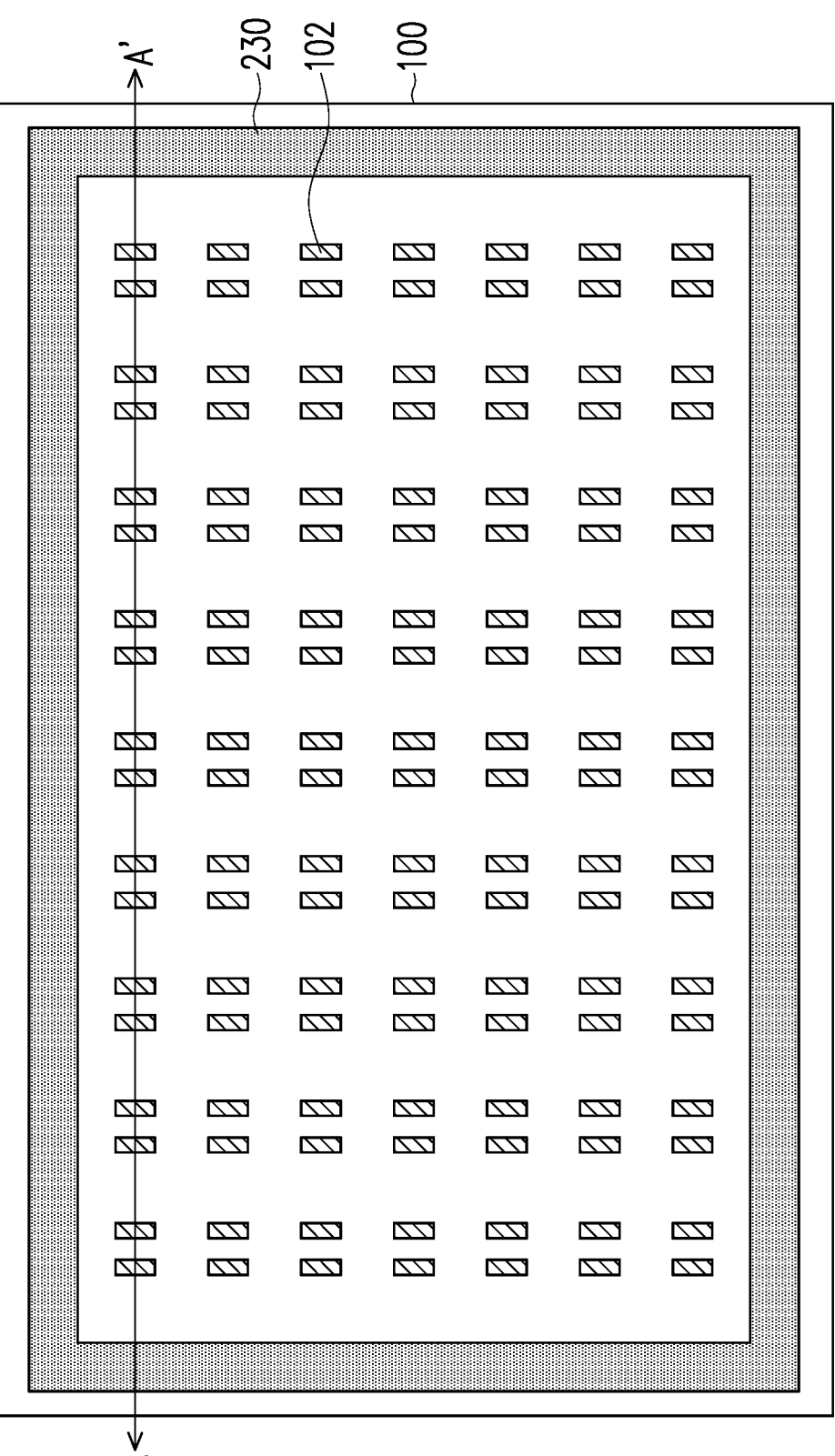
Figure 2C:
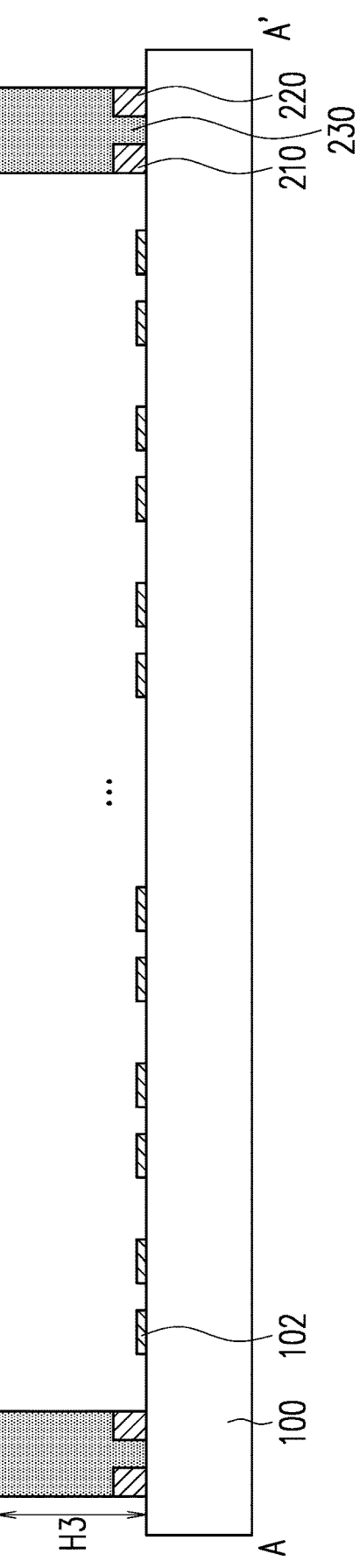

Referring to FIG. 1C and FIG. 2C, a glue layer 230 is formed in the gap 215 between the first supporting structure 210 and the second supporting structure 220. The glue layer 230 can be better positioned in the fabrication process through the gap 215. The glue layer 230 is a closed ring or an open ring, and the glue layer 230 includes a circular or non-circular ring.

The glue layer 230 covers the opposite sides of the first supporting structure 210 and the second supporting structure 220 and also covers the top surfaces of the first supporting structure 210 and the second supporting structure 220. The glue layer 230 has a height H3.

In some embodiments, a method of forming the glue layer 230 includes: coating a glue layer material on the first supporting structure 210 and the second supporting structure 220, and then curing the glue layer material to form the glue layer 230. The method of curing the glue layer material includes light curing or thermal curing. The material of the glue layer 230 is different from the materials of the first supporting structure 210 and the second supporting structure 220. In some embodiments, the material of the glue layer 230 includes plastic, such as acrylic resin, fluororesin, silicone, other suitable materials, or a combination of the foregoing materials. In some embodiments, the material of the glue layer 230 further includes plasticizers, initiators, fillers, and so on. The fillers are, for example, organic fillers or inorganic fillers. In some embodiments, the content of plasticizer in glue layer 230 is 20 wt % to 80 wt %. In some embodiments, the fillers in the glue layer 230 have a particle size of 2 micrometers to 600 micrometers.

Figure 1D:
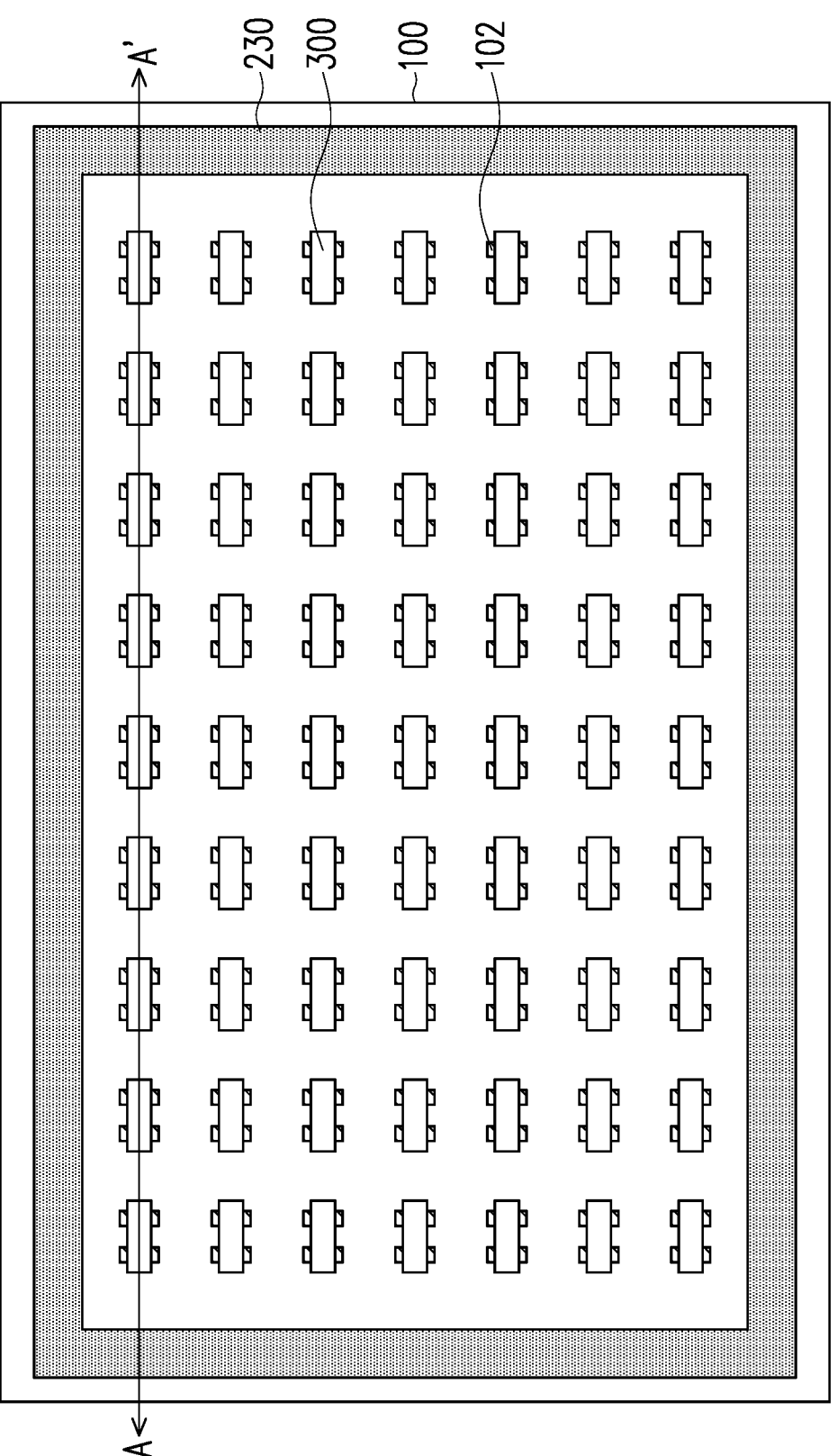
Figure 2D:
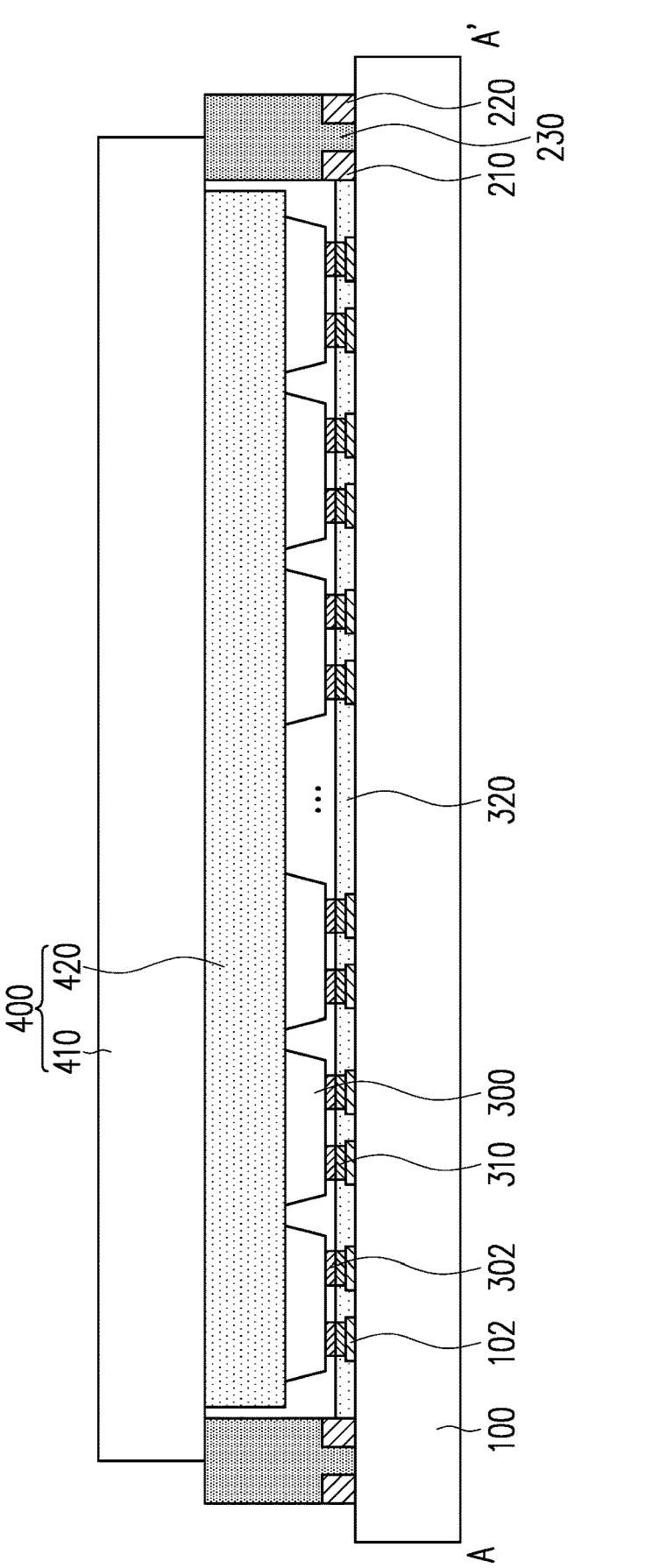

Referring to FIG. 1D and FIG. 2D, the light-emitting diodes 300 are transferred onto the circuit substrate 100 using the transfer device 400 (not shown in FIG. 1D), wherein the transfer device 400 is pressed on the glue layer 230, and the light-emitting diodes 300 are located on the electrodes 102. The electrodes 302 of the light-emitting diodes 300 are electrically connected to the electrodes 102 of the circuit substrate 100 through the solders 310. In this embodiment, before placing the plurality of light-emitting diodes 300 on the circuit substrate 100, a flux layer 320 is formed on the electrodes 102. In this embodiment, the flux layer 320 is formed after forming the glue layer 230, but the invention is not limited thereto. In other embodiments, the flux layer 320 is formed before forming the glue layer 230.

The transfer device 400 includes, for example, a transfer substrate 410 and a buffer layer 420. In some embodiments, after the plurality of light-emitting diodes 300 are formed on a growth substrate (not shown), the transfer device 400 is used to pick up the light-emitting diodes 300 from the growth substrate and transfer them to other locations. In some embodiments, the buffer layer 420 is adhesive and is used to adhere the light-emitting diodes 300, but the invention is not limited thereto. In other embodiments, the light-emitting diodes 300 are picked up using static electricity, vacuum, Van der Waals forces, or other methods.

Figure 1E:
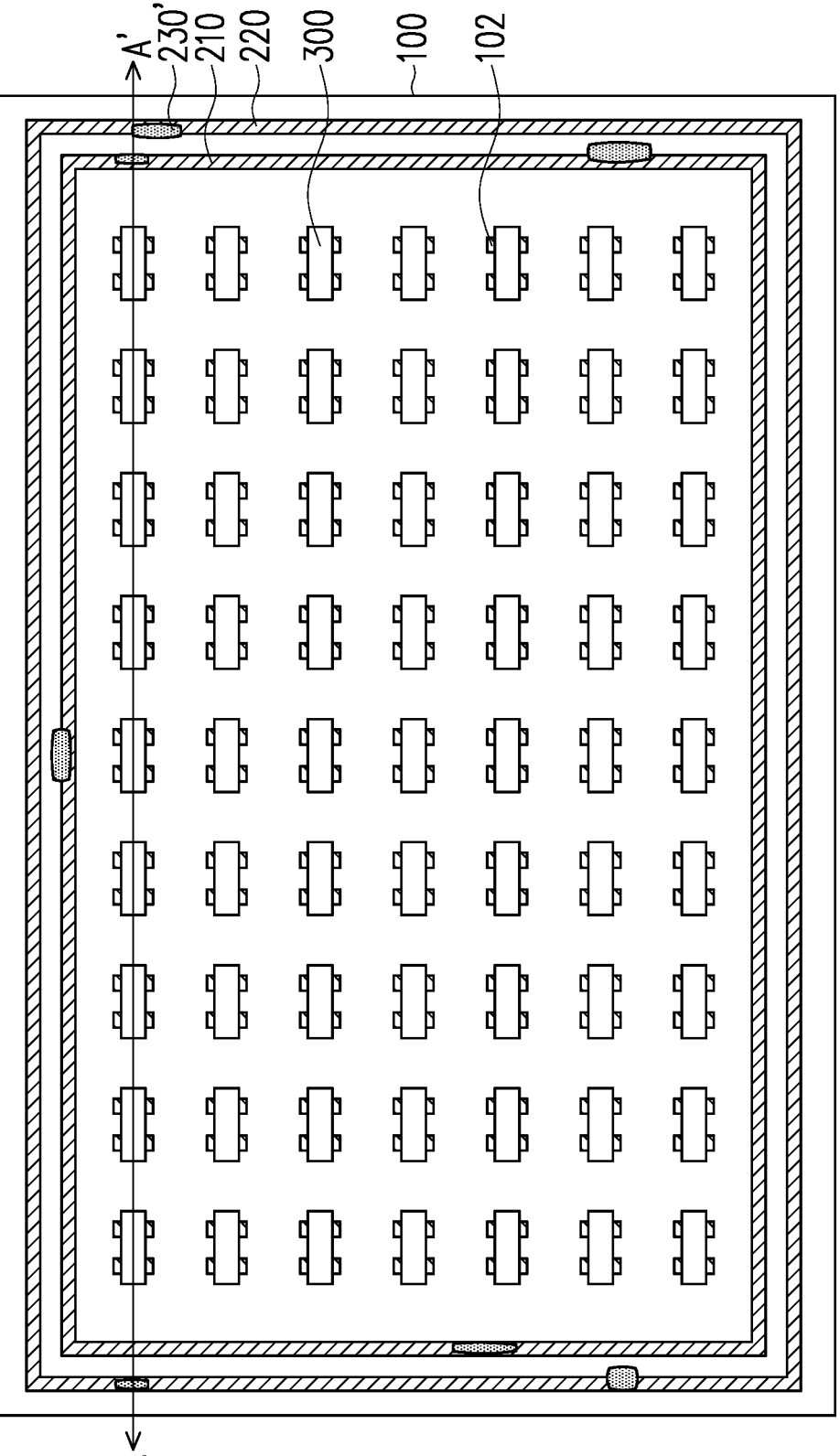
Figure 2E:
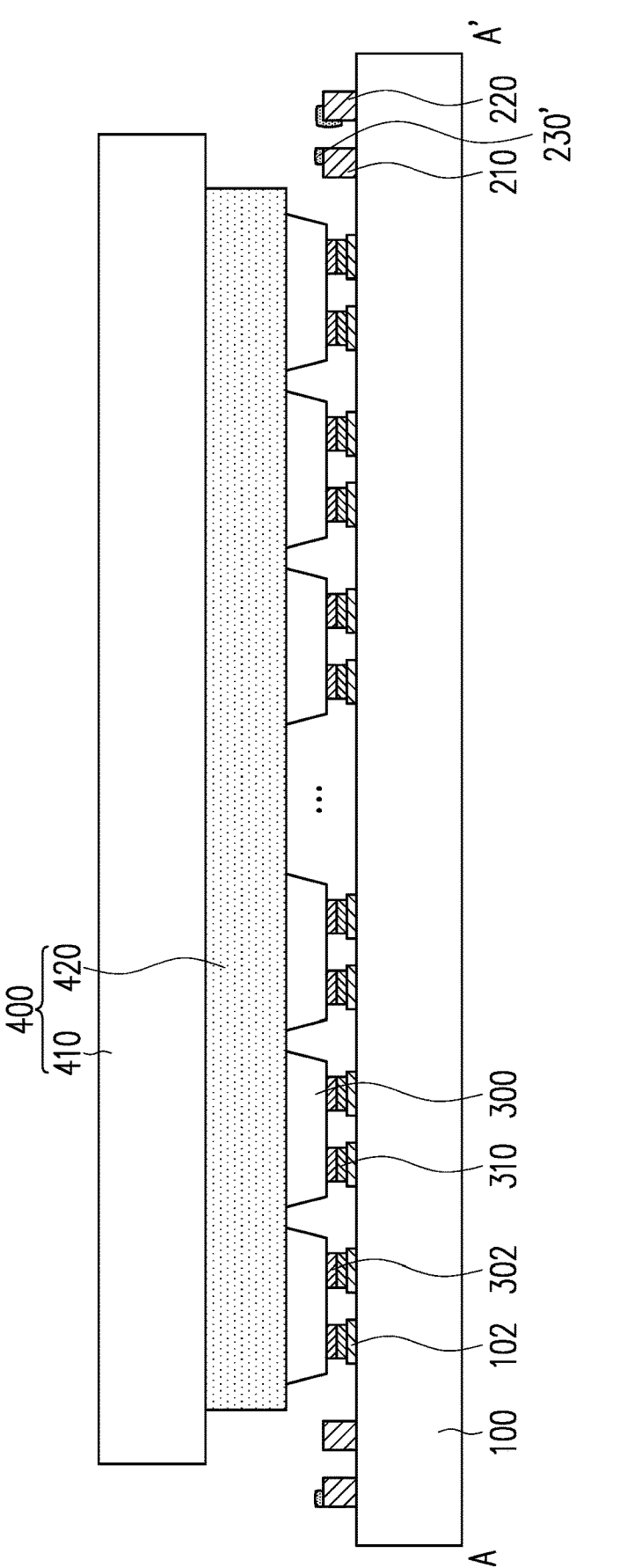

Referring to FIG. 1E and FIG. 2E, when the transfer device 400 (not shown in FIG. 1E) is pressed onto the glue layer 230, the light-emitting diodes 300 are soldered to the electrodes 102. Specifically, the solders 310 are heated to solder the electrodes 302 of the light-emitting diode 300 to the electrodes 102 of the circuit substrate 100. In some embodiments, the solders 310 are heated using laser heating, but the invention is not limited thereto. In other embodiments, the solders 310 are heated using the transfer device 400.

In some embodiments, the flux layer 320 may be removed during the process of heating the solders 310. In this embodiment, the flux layer 320 is completely removed, but the invention is not limited thereto. In other embodiments, at least part of the flux layer 320 remains on the circuit substrate 100 after the process of heating the solders 310.

The glue layer 230 is removed, leaving a glue layer residue 230' on the first supporting structure 210 and the second supporting structure 220. In some embodiments, the glue layer residue 230' and the glue layer 230 (referring to FIG. 2D) have the same material and the same physical properties.

In some embodiments, external force is used to peel off or tear off the glue layer 230. In certain embodiments, a cross-cut test result of the material of the glue layer 230 on a glass substrate is 0 to 1B, while a cross-cut test result of the materials of the first supporting structure 210 and the second supporting structure 220 on a glass substrate is 2B or higher. In other words, the glue layer 230 is more easily to peel off (or tear off) relative to the first supporting structure 210 and the second supporting structure 220, thereby preventing damage to the first supporting structure 210 and the second supporting structure 220 when removing the glue layer 230.

The glue layer residue 230' partially covers the surface of the first supporting structure 210 and/or the surface of the second supporting structure 220. For example, the glue layer residue 230' partially covers the top surface of the first supporting structure 210, the side surfaces of the first supporting structure 210, the top surface of the second supporting structure 220, and/or the side surfaces of the second supporting structure 220.

Figure 1F:
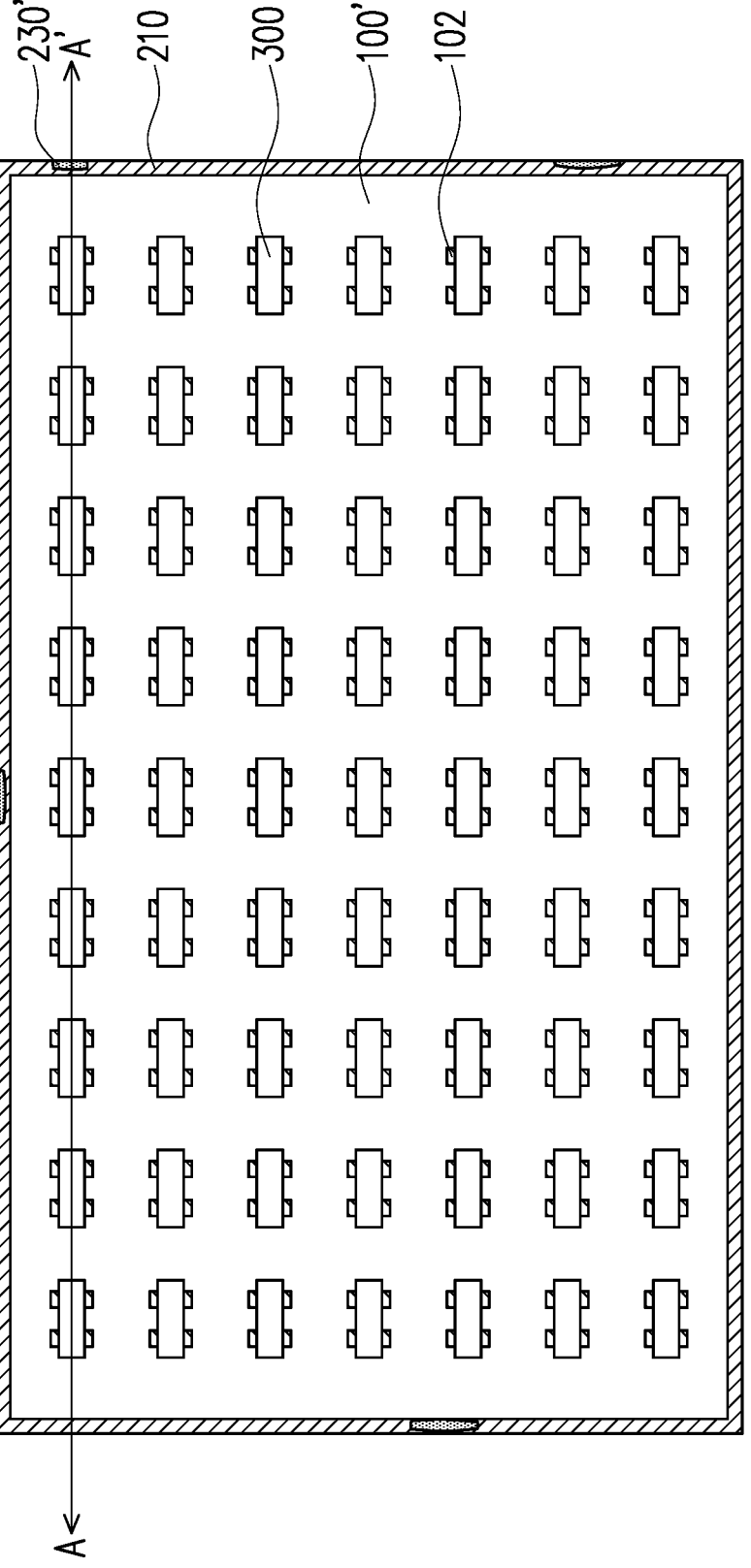
Figure 2F:
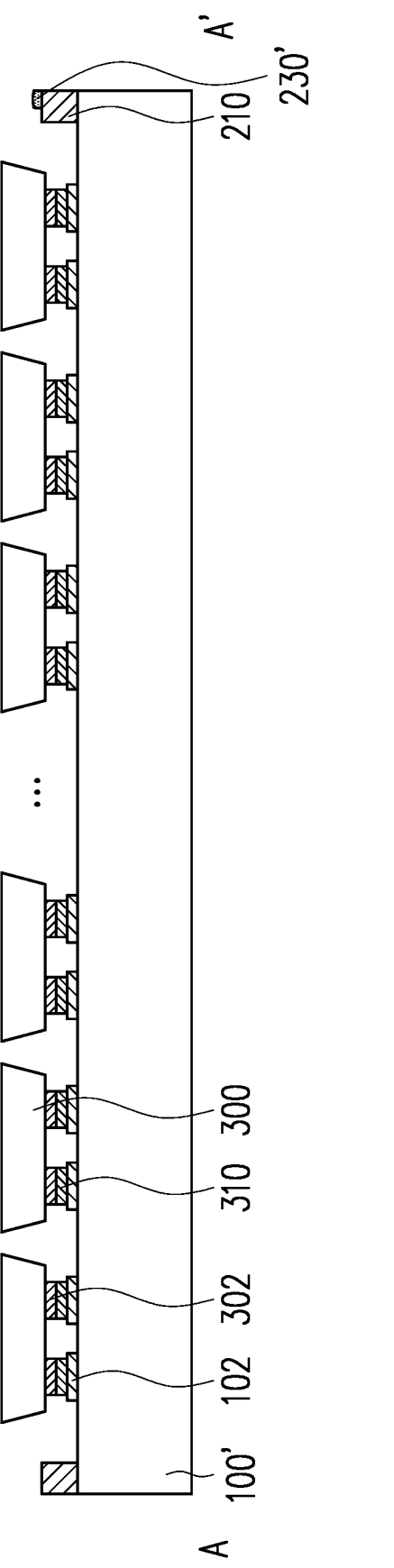

Referring to FIG. 1F and FIG. 2F, the transfer device 400 is removed, leaving the light-emitting diodes 300 on the circuit substrate 100. The circuit substrate 100 is cut to remove the second supporting structure 220 and form a circuit substrate 100'. In some embodiments, the cutting path when cutting the circuit substrate 100 overlaps with the gap between the first supporting structure 210 and the second supporting structure 220. This makes the cutting process easier to control. More specifically, because the cutting process only needs to cut the circuit substrate 100 without cutting the first supporting structure 210 and the second supporting structure 220, it is easier to adjust the parameters of the cutting process.

The edge of circuit substrate 100' is ground. In some embodiments, after grinding the edge of the circuit substrate 100', the first supporting structure 210 is aligned with at least one sidewall of the circuit substrate 100'. In some embodiments, in addition to removing a portion of the circuit substrate 100', the grinding process also removes a portion of the first supporting structure 210.

Figure 1G:
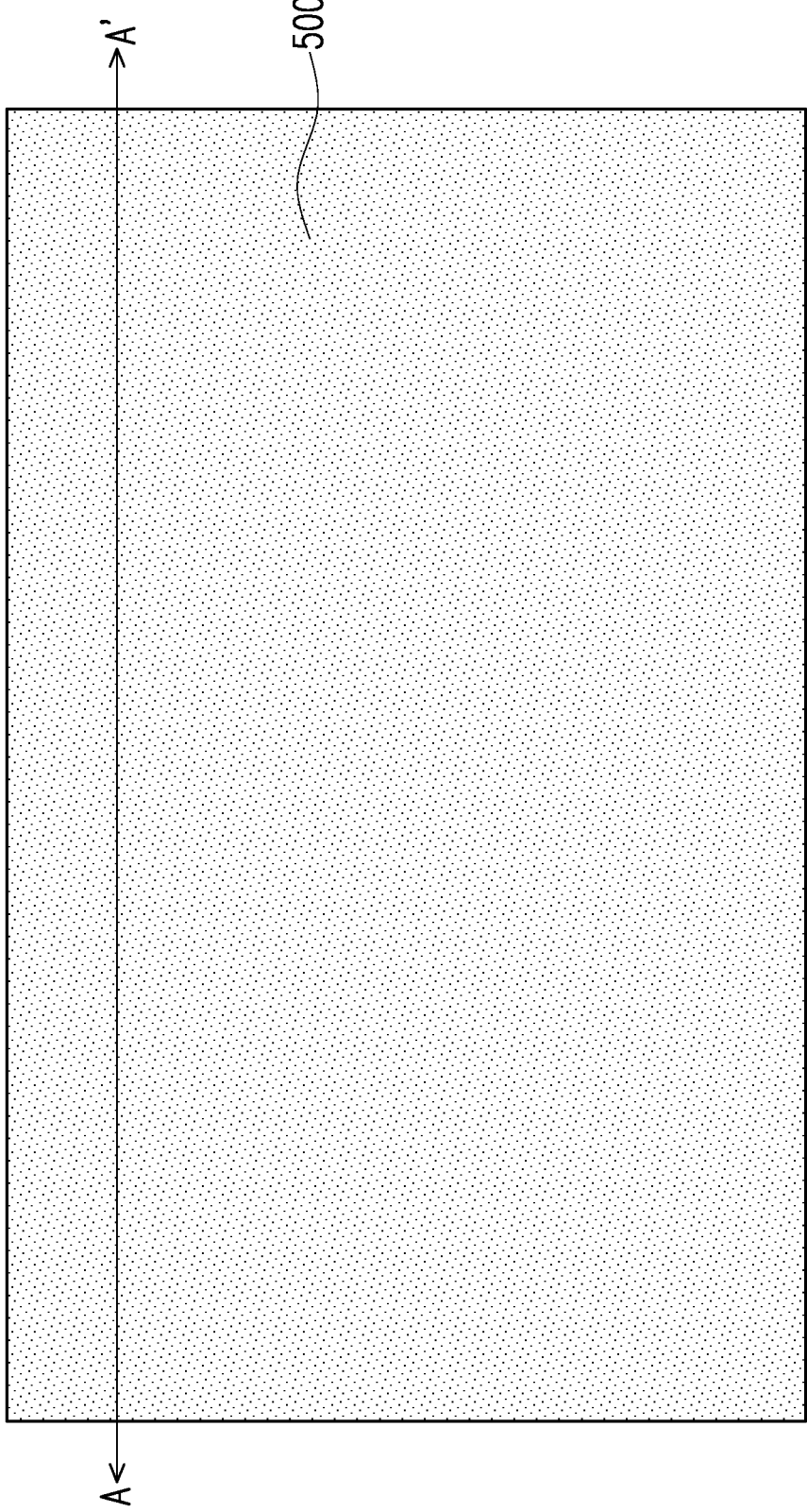
Figure 2G:
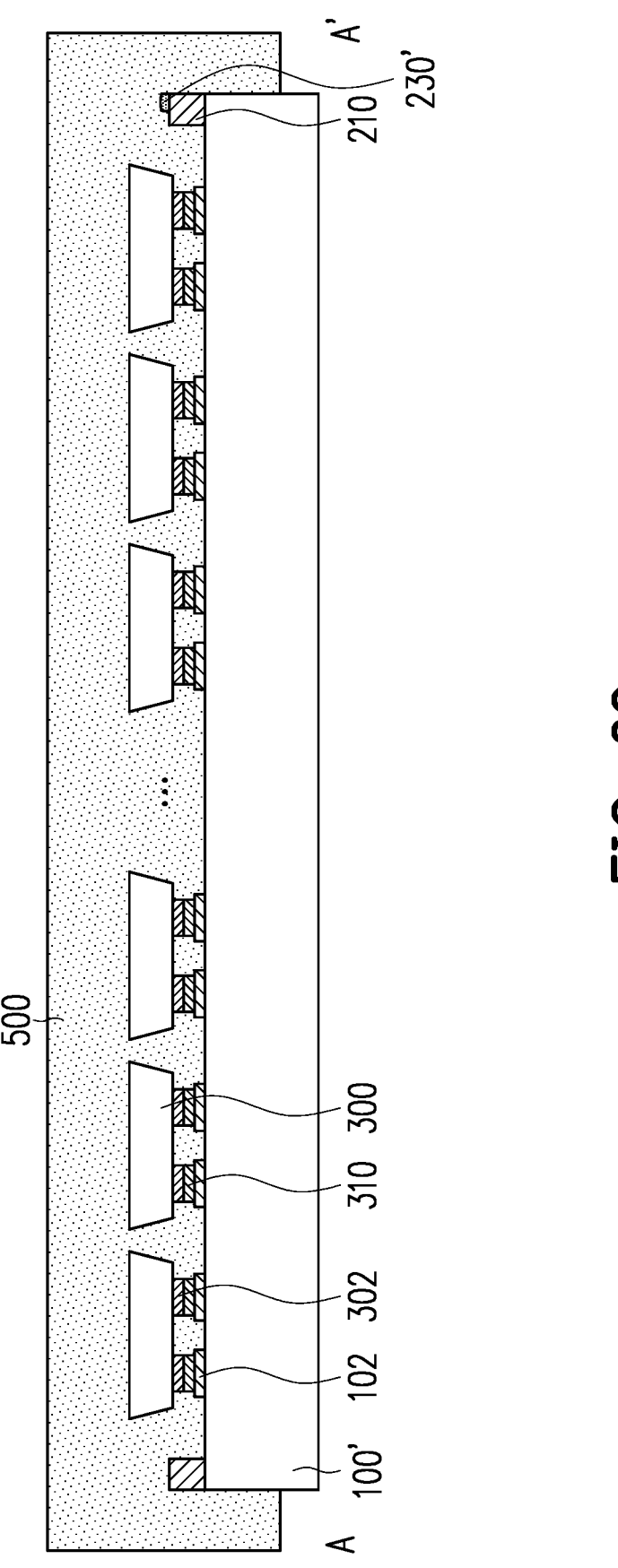

Referring to FIG. 1G and FIG. 2G, an encapsulant 500 is formed on the light-emitting diodes 300. The encapsulant 500 encapsulates the light-emitting diodes 300 on the circuit substrate 100'. In this embodiment, the encapsulant 500 also covers the top surface of the first supporting structure 210 and the side surfaces of the first supporting structure 210, and the encapsulant 500 partially or completely covers the side surfaces of the circuit substrate 100'.

Figure 1H:
Figure 2H:
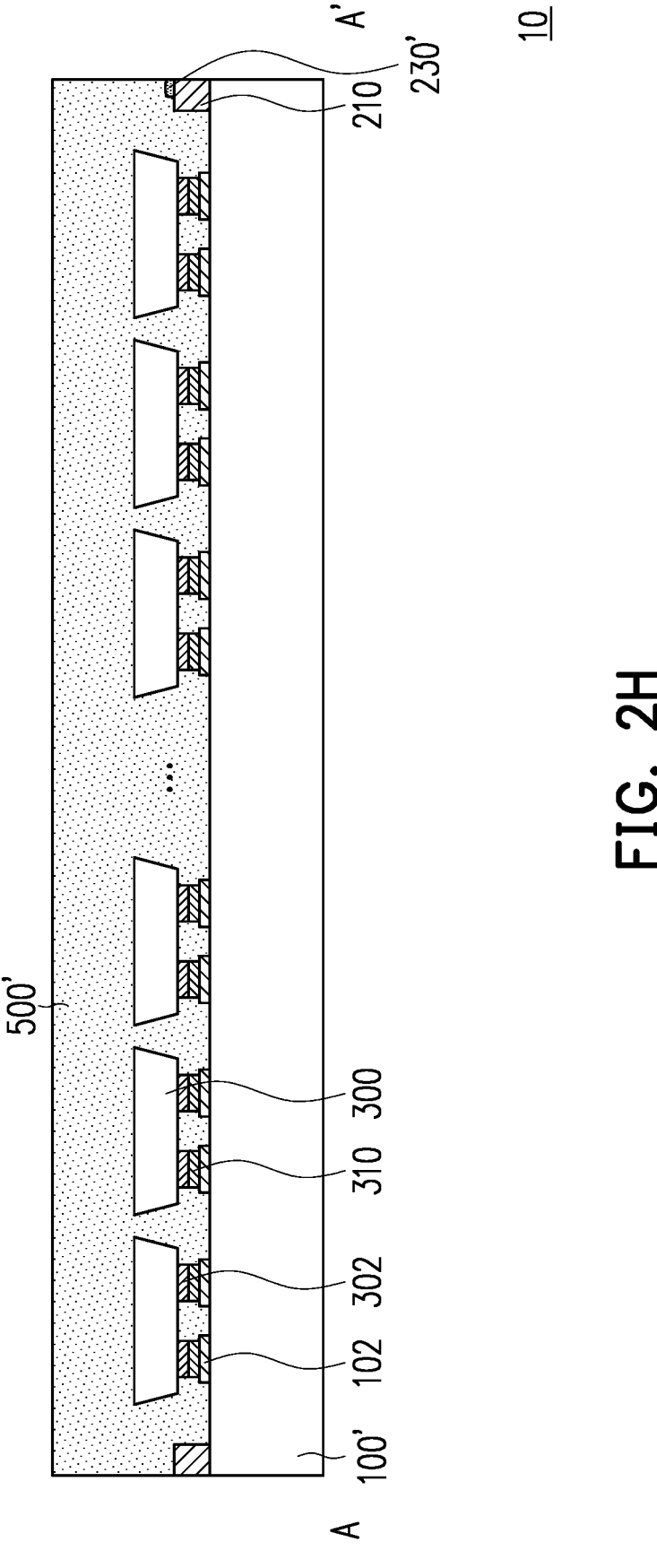

Referring to FIG. 1H and FIG. 2H, the encapsulant 500 is cut to form the encapsulant 500'. The first supporting structure 210 is aligned with at least one sidewall of the encapsulant 500' and at least one sidewall of the circuit substrate 100'.

At this point, the display panel 10 is roughly completed. The display panel 10 includes the circuit substrate 100', the first supporting structure 210, a glue layer residue 230', the plurality of light-emitting diodes 300 and the encapsulant 500'.

Figure 3A:
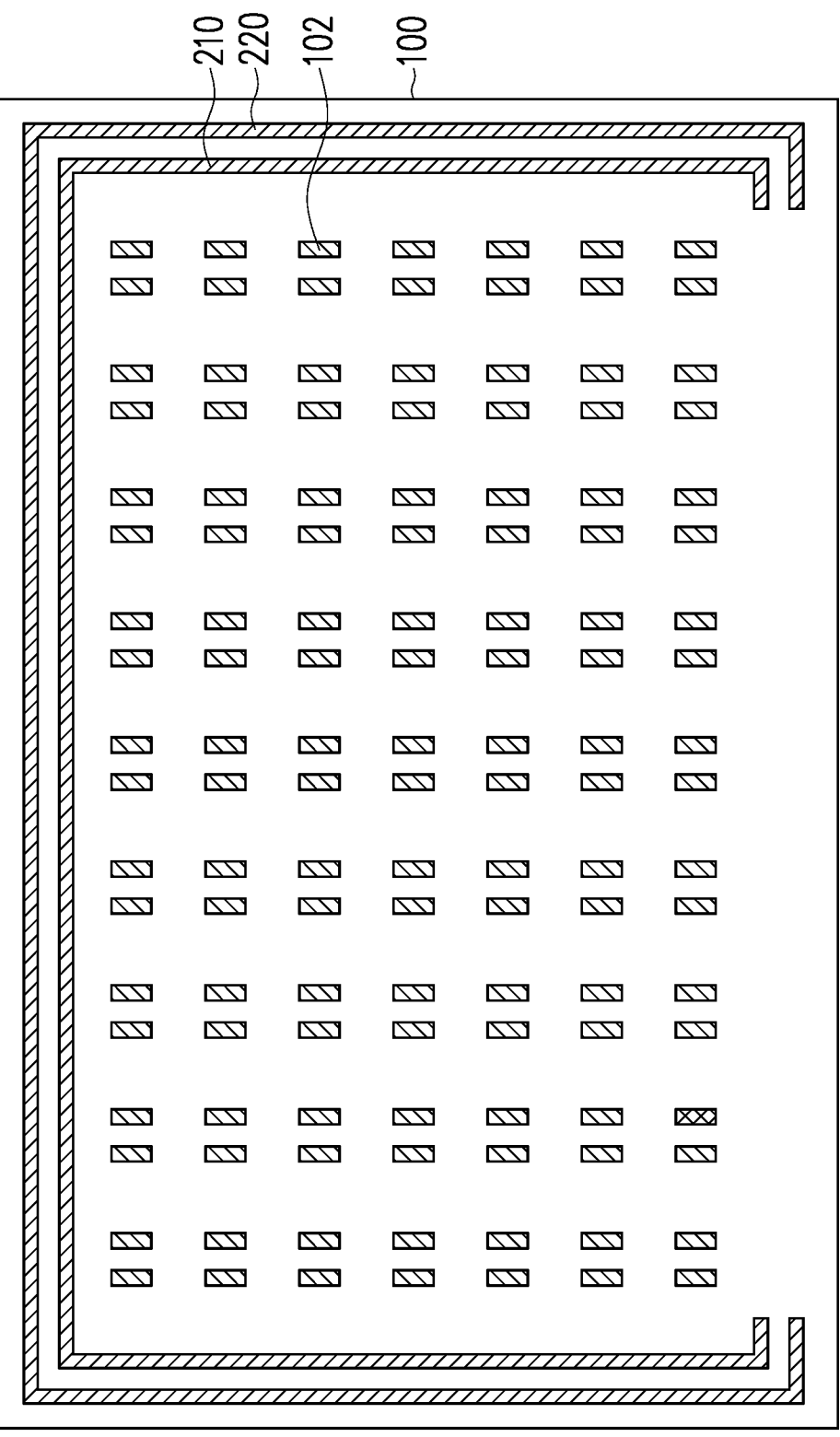
FIG. 3A to FIG. 3C are schematic top views of a fabrication method of a display panel according to another embodiment of the present invention.
Figure 3B:
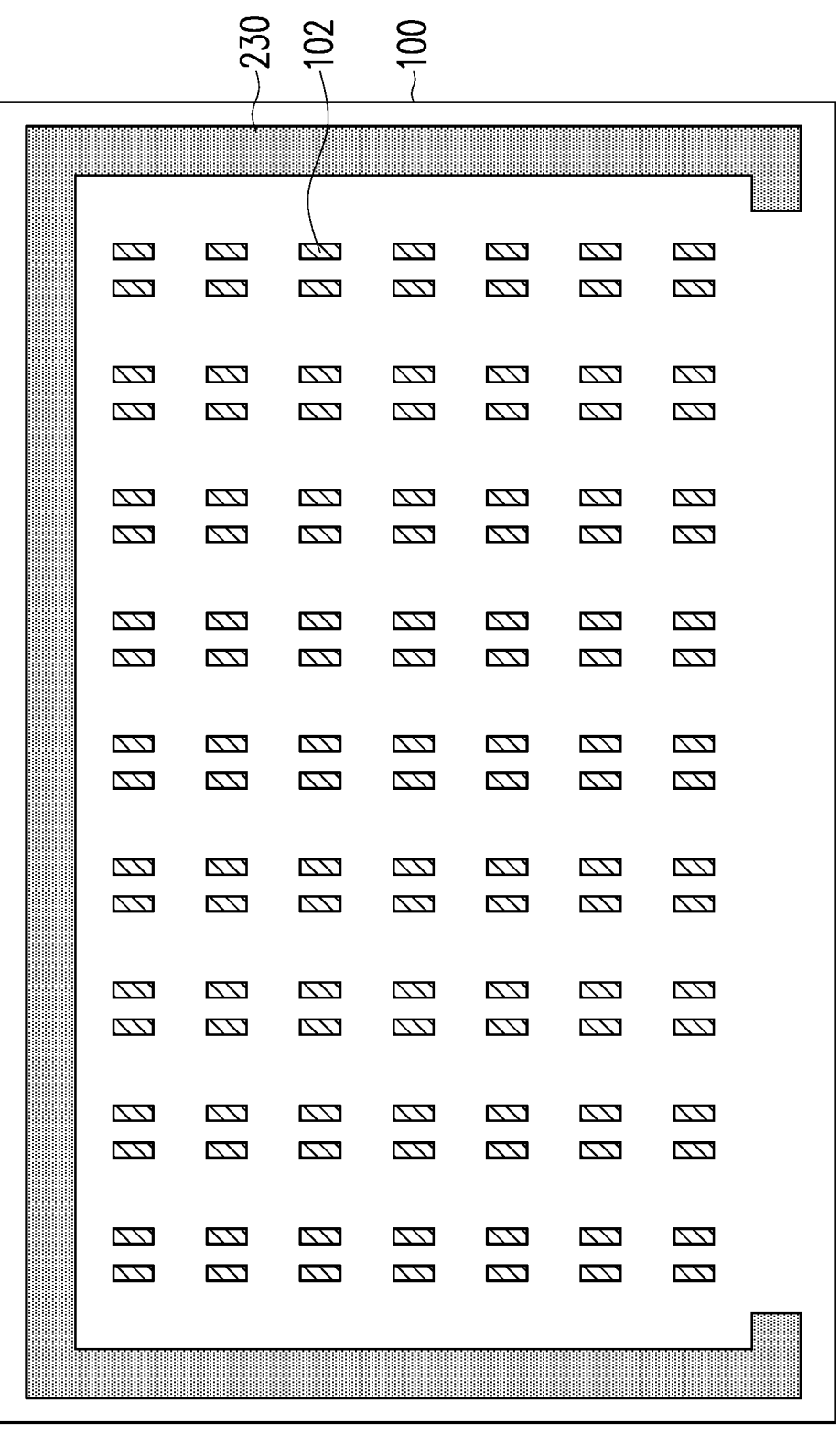
Figure 3C:
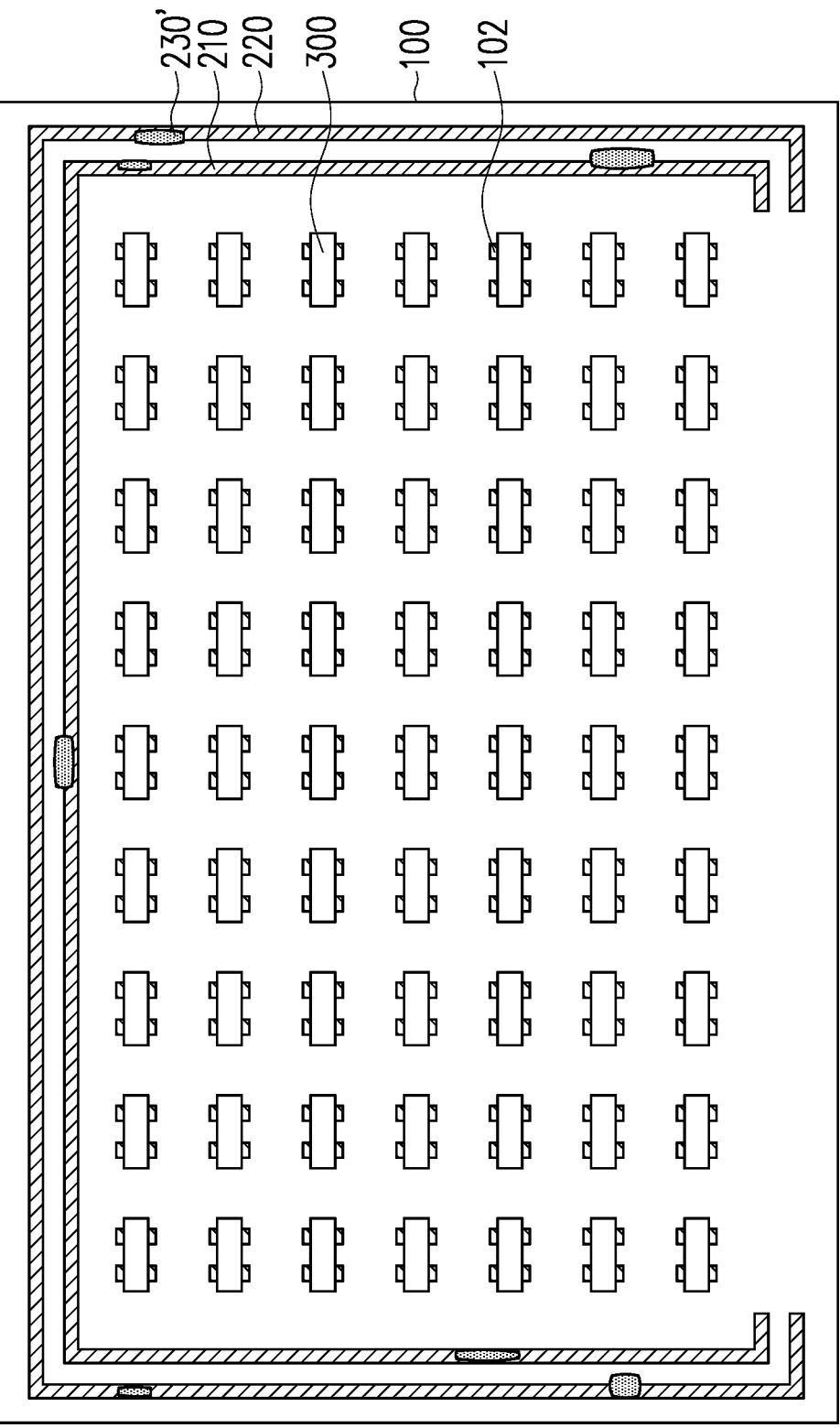

FIG. 3A to FIG. 3C are schematic top views of a fabrication method of a display panel according to another embodiment of the present invention. It should be noted herein that, in embodiments provided in FIG. 3A to FIG. 3C, element numerals and partial content of the embodiments provided in FIG. 1A to FIG. 1H are followed, the same or similar reference numerals being used to represent the same or similar elements, and description of the same technical content being omitted. For a description of an omitted part, reference may be made to the foregoing embodiment, and the descriptions thereof are omitted herein. FIG. 3A to FIG. 3C respectively correspond to the process steps of FIG. 1B, FIG. 1C and FIG. 1D. The difference therebetween is that in the embodiment of FIG. 3A to FIG. 3C, the first supporting structure 210, the second supporting structure 220 and the glue layer 230 are open rings, and the first supporting structure 210, the second supporting structure 220 and the glue layer 230 do not completely surround the light-emitting diodes 300.

Figure 4:
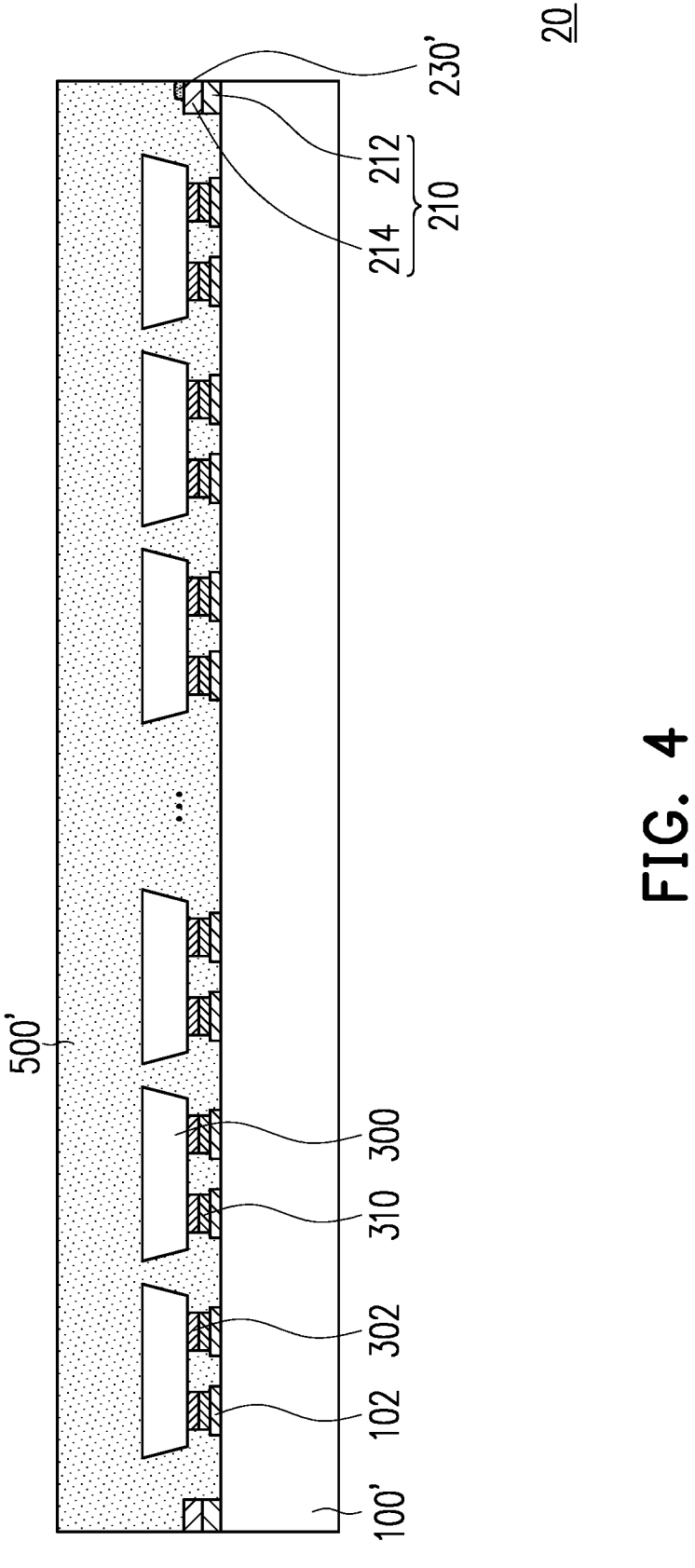
FIG. 4 is a schematic cross-sectional view of a display panel according to yet another embodiment of the present invention.

FIG. 4 is a schematic cross-sectional view of a display panel according to yet another embodiment of the present invention. It should be noted herein that, in embodiments provided in FIG. 4, element numerals and partial content of the embodiments provided in FIG. 2A to FIG. 2H are followed, the same or similar reference numerals being used to represent the same or similar elements, and description of the same technical content being omitted. For a description of an omitted part, reference may be made to the foregoing embodiment, and the descriptions thereof are omitted herein.

The difference between the display panel 20 in FIG. 4 and the display panel 10 in FIG. 2H is that the first supporting structure 210 of the display panel 20 in FIG. 4 has a multi-layer structure and includes a first layer 212 and a second layer 214 that are overlapped with each other. In some embodiments, the first layer 212 and the second layer 214 include the same or different materials from each other.

In some embodiments, during the process of manufacturing the display panel 20, the second supporting structure (not shown) used may also have a multi-layer structure. For example, the second supporting structure also includes the first layer and the second layer, the first layer 212 of the first supporting structure 210 and the first layer of the second supporting structure are formed simultaneously, and the second layer 214 of the first supporting structure 210 and the second layer of the second supporting structure are formed simultaneously.

Based on the above, when transferring the light-emitting diodes onto the circuit substrate, the glue layer can be used to support the transfer device. Therefore, the process yields of transferring the light-emitting diodes can be improved. Even when transferring more light-emitting diodes simultaneously, sufficient process yields can still be maintained. Furthermore, by transferring more light-emitting diodes simultaneously, the cycle time for producing the display panel can be reduced.

What is claimed is:

1. A fabrication method of a display panel, comprising:
providing a circuit substrate with a plurality of electrodes on a surface thereof;
forming a first supporting structure and a second supporting structure on the circuit substrate, wherein the first supporting structure is located outside the electrodes on the circuit substrate, the second supporting structure is located outside the first supporting structure on the circuit substrate, and there is a gap between the first supporting structure and the second supporting structure;
forming a glue layer in the gap between the first supporting structure and the second supporting structure;
transferring a plurality of light-emitting diodes onto the circuit substrate by a transfer device, wherein the transfer device is pressed on the glue layer, and the plurality of light-emitting diodes are located on the plurality of electrodes;
removing the glue layer, leaving a glue layer residue on the first supporting structure and the second supporting structure;
removing the transfer device, leaving the plurality of light-emitting diodes on the circuit substrate;
cutting the circuit substrate to remove the second supporting structure; and
grinding an edge of the circuit substrate.

2. The fabrication method of claim 1, wherein after grinding the edge of the circuit substrate, the first supporting structure is aligned with at least one sidewall of the circuit substrate.

3. The fabrication method of claim 1, further comprises: when the transfer device is pressed on the glue layer, the plurality of light-emitting diodes are welded to the plurality of electrodes.

4. The fabrication method claim 1, further comprises:
forming an encapsulant on the plurality of light-emitting diodes; and
cutting the encapsulant, wherein the first supporting structure is aligned with at least one sidewall of the encapsulant.

5. The fabrication method claim 1, wherein the first supporting structure, the second supporting structure and the glue layer are closed rings or open rings, and the first supporting structure, the second supporting structure and the glue layer include circular or non-circular rings.

\* \* \* \* \*